(12) United States Patent
Segev et al.

(10) Patent No.: US 11,442,106 B2
(45) Date of Patent: Sep. 13, 2022

(54) METHOD AND APPARATUS FOR DEBUGGING INTEGRATED CIRCUIT SYSTEMS USING SCAN CHAIN

(71) Applicant: Western Digital Technologies, Inc., San Jose, CA (US)

(72) Inventors: Amir Segev, Meitar (IL); Shay Benisty, Beer Sheva (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/184,430

(22) Filed: Feb. 24, 2021

(65) Prior Publication Data

US 2022/0187369 A1 Jun. 16, 2022

Related U.S. Application Data

(60) Provisional application No. 63/125,248, filed on Dec. 14, 2020.

(51) Int. Cl.
| | |
|---|---|
| *G01R 31/3185* | (2006.01) |
| *G01R 31/3181* | (2006.01) |
| *G01R 31/317* | (2006.01) |
| *G01R 31/3177* | (2006.01) |
| *G01R 31/327* | (2006.01) |

(52) U.S. Cl.
CPC . *G01R 31/318536* (2013.01); *G01R 31/3177* (2013.01); *G01R 31/31701* (2013.01); *G01R 31/31705* (2013.01); *G01R 31/31813* (2013.01)

(58) Field of Classification Search
None
See application file for complete search history.

(56) References Cited

U.S. PATENT DOCUMENTS

| | | |
|---|---|---|
| 6,941,498 B2 | 9/2005 | Hartano et al. |
| 7,409,612 B2 | 8/2008 | Van De Logt et al. |
| 7,945,834 B2 | 5/2011 | Waayers et al. |

(Continued)

OTHER PUBLICATIONS

"Scan Test: Additional logic that connects registers into a shift register or scan chain for increased test efficiency", Semiconductor Engineering, https://semiengineering.com/knowledge_centers/test/scan-test-2/, Last accessed on Nov. 11, 2020, 7 pages.

*Primary Examiner* — April Y Blair
*Assistant Examiner* — Dipakkumar B Gandhi
(74) *Attorney, Agent, or Firm* — Loza & Loza, LLP; Gabriel Fitch

(57) ABSTRACT

A circuit debug apparatus for debugging an integrated circuit that causes a functional fault may include a processor configured to extract a scan pattern of a scan chain of the integrated circuit while the integrated circuit is in a scan mode. The scan pattern includes a plurality of logic states for a corresponding plurality of logic circuits of the integrated circuit. The processor may also be configured to apply a modified scan pattern to the integrated circuit while the integrated circuit is in the scan mode, where the modified scan pattern includes a test pattern configured to eliminate the functional fault. The processor may be further configured to determine whether the integrated circuit with the modified scan pattern produces the functional fault while the integrated circuit is in a functional mode.

17 Claims, 6 Drawing Sheets

(56) References Cited

U.S. PATENT DOCUMENTS

| | | | |
|---|---|---|---|
| 2006/0111873 A1* | 5/2006 | Huang | G06F 11/27 |
| | | | 702/185 |
| 2008/0005632 A1* | 1/2008 | Inoue | G01R 31/31853 |
| | | | 714/724 |
| 2009/0172615 A1* | 7/2009 | Ortiz | G01R 31/318536 |
| | | | 716/106 |
| 2010/0332924 A1* | 12/2010 | Ziaja | G11C 29/50012 |
| | | | 714/726 |
| 2013/0275824 A1* | 10/2013 | Tekumalla | G11C 29/32 |
| | | | 714/726 |
| 2014/0101500 A1 | 4/2014 | Bastimane et al. | |
| 2014/0101505 A1* | 4/2014 | Tekumalla | G01R 31/318552 |
| | | | 714/729 |
| 2015/0074477 A1* | 3/2015 | Bheemanna | G01R 31/3177 |
| | | | 714/727 |
| 2020/0135246 A1 | 4/2020 | Bartling et al. | |
| 2020/0174069 A1 | 6/2020 | Narayanan et al. | |

* cited by examiner

METHOD AND APPARATUS FOR DEBUGGING INTEGRATED CIRCUIT SYSTEMS USING SCAN CHAIN

CROSS-REFERENCE TO RELATED APPLICATIONS

This application claims priority to and the benefit of U.S. Provisional Patent Application No. 63/125,248, filed on Dec. 14, 2020 entitled, "METHOD AND APPARATUS FOR DEBUGGING INTEGRATED CIRCUIT SYSTEMS USING SCAN CHAIN," the entire content of which is incorporated herein by reference.

FIELD

The disclosure relates to methods and apparatuses for debugging integrated circuit systems. More specifically, the disclosure relates to methods and apparatuses that employ scan-chain processes for debugging integrated circuits that are causing functional bugs in the operation of a device or system.

INTRODUCTION

During functional testing of an apparatus, various operational scenarios implemented by one or more integrated circuits, e.g., systems on chip (SoCs), are run on the apparatus to detect for functional failures or bugs caused by the SoC. For example, in the case of a solid state device (SSD), an operational scenario, such as a read operation, a write operation, or a power down operation, may be run on the SSD to detect for functional failures or bugs caused by a SoC that implements the respective operation. If a functional bug caused by a SoC is detected, a debug process may be initiated to determine a possible cause of the failure and to propose a workaround solution that fixes the functionality of the SoC so that the operation of the apparatus no longer fails because of the SoC bug.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a method of debugging an integrated circuit that causes a functional fault while the integrated circuit is in a functional mode. The method includes extracting, while the integrated circuit is in a scan mode, a scan pattern of a scan chain of the integrated circuit. The scan pattern comprises a plurality of logic states for a corresponding plurality of logic circuits that define the scan chain. The method also includes testing at least one test pattern to eliminate the functional fault by inputting, while the integrated circuit is in a scan mode, a test pattern into the scan chain The test pattern is configured to eliminate the functional fault. The method further includes determining, while the integrated circuit is in the functional mode, if the test pattern produces the functional fault.

Another embodiment of the disclosure provides a circuit debug apparatus for debugging an integrated circuit that causes a functional fault while the integrated circuit is in a functional mode. The apparatus includes means for extracting, while the integrated circuit is in a scan mode, a scan chain pattern comprising a plurality of logic states for a corresponding plurality of sequential logic circuits of the integrated circuit. The apparatus also includes means for applying, while the integrated circuit is in a scan mode, a modified scan chain pattern to the integrated circuit, wherein the modified scan chain pattern includes a test pattern configured to eliminate the functional fault. The apparatus further includes means for determining, while the integrated circuit is in the functional mode, whether the integrated circuit with the modified scan chain pattern produces the functional fault.

Another embodiment of the disclosure provides a circuit debug apparatus for debugging an integrated circuit that causes a functional fault while the integrated circuit is in a functional mode. The circuit debug apparatus includes a processor configure to extract a scan pattern of a scan chain of the integrated circuit while the integrated circuit is in a scan mode. The scan pattern comprises a plurality of logic states for a corresponding plurality of logic circuits of the integrated circuit. The processor is also configured to apply a modified scan pattern to the integrated circuit while the integrated circuit is in a scan mode. The modified scan pattern includes a test pattern configured to eliminate the functional fault. The processor is further configured to determine whether the integrated circuit with the modified scan pattern produces the functional fault while the integrated circuit is in the functional mode.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
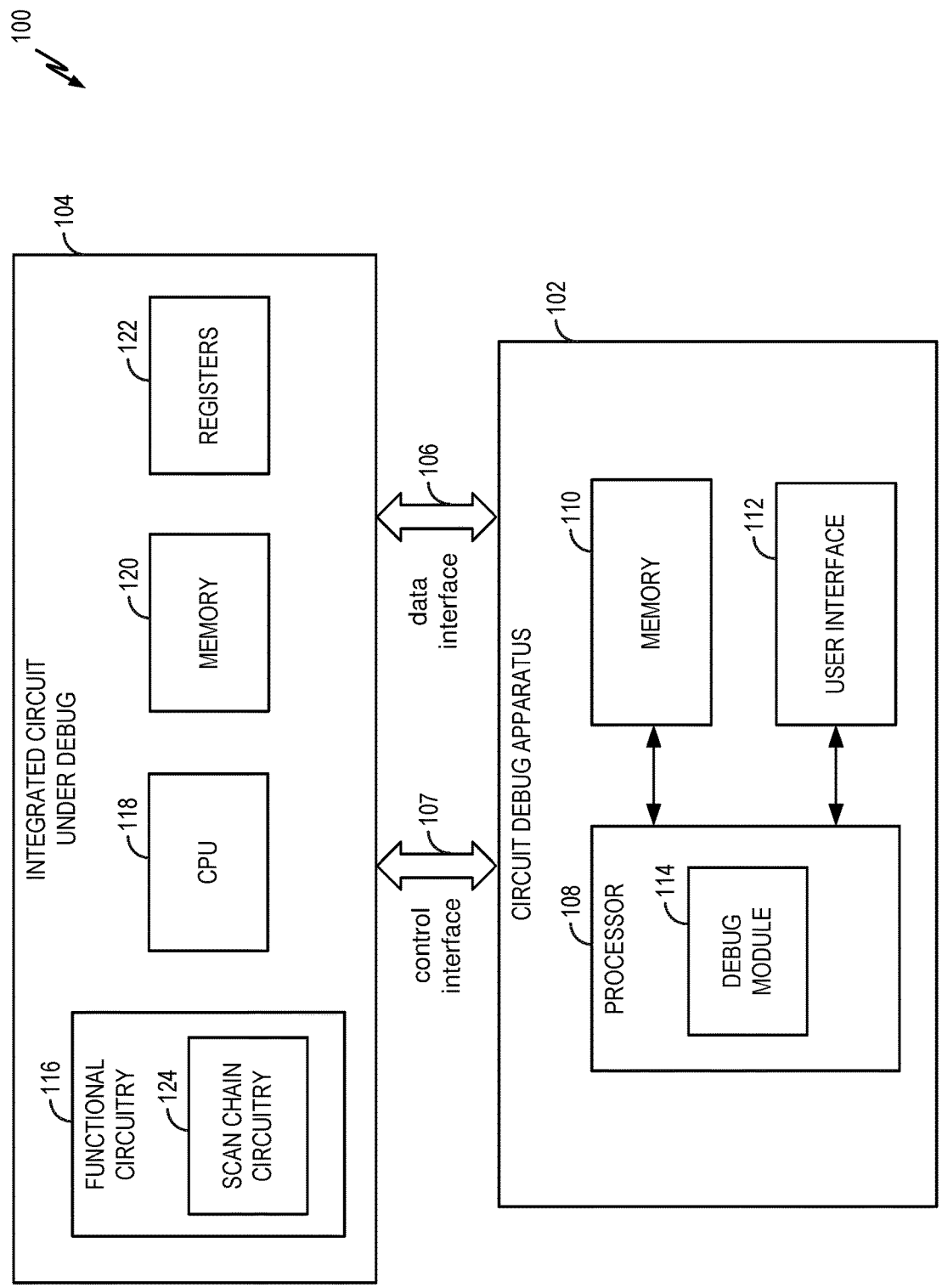
FIG. 1 is a block diagram of an integrated circuit debug system including a circuit debug apparatus and an integrated circuit (IC) under debug.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

As previously mentioned, during functional testing of an apparatus, various operational scenarios implemented by one or more integrated circuits, e.g., systems on chip (SoCs), are run on the apparatus to detect for functional failures or bugs caused by the SoC. For example, in the case of a solid state device (SSD), an operational scenario, such as a read operation, a write operation, or a power down operation, may be run on the SSD to detect for functional failures or bugs caused by a SoC that implements the respective operation. If a functional bug caused by a SoC is detected, a debug process may be initiated to determine a possible cause of the failure and to propose a workaround solution that fixes the functionality of the SoC so that the operation of the apparatus no longer fails because of the SoC bug.

Under conventional debug processes, debug information relevant to functional failures or bugs encountered during testing of a function implemented by a SoC are collected and forwarded to an engineering team for failure analyses and workaround proposals. This debug information may include, for example, the status or logic states of various logic components, e.g., flip-flops, of the SoC captured at the time of a functional failure. These logic states may be captured in registers of the SoC and recorded and preserved in a memory of the SoC as predefined debug information. Furthermore, debug information can be pushed out of the SoC using an external interface to an external storage in order to increase the amount of collectable debug information. Additional non-conventional debug information may also be obtained during a debug process using an information extraction method, such as scan chain, whereby the logic states of additional flip-flops are captured.

Regarding predefined debug information, given the large number of flip-flops, e.g., millions of flip-flops, associated with a SoC it is impractical to capture and maintain debug information for every flip-flop. Accordingly, a SoC may be preconfigured during its design stage to associate different sets of flip-flops with different functions, and to store the logic states of those flip-flops that are associated with a particular function, when that function fails. For example, in the case of a SoC for a SSD, a set of flip-flops may be involved in executing a read command. Thus, upon failure of a read command, the SoC may store the logic states of all or a subset of the flip-flops in that set in the on-chip memory of the SoC.

While storing predefined debug information in this manner provides useful information for a debug process, it does not enable access to all possible information. For example, continuing with the example of the read command of the SSD, the predefined set of flip-flops that the SoC associates with a read command may not encompass every flip-flop involved in the read command. Accordingly, debug information of flip-flops involved in the read command, but not included in the predefined set of flip-flops, may be unavailable during a debug process. As SoC functionality and functional bugs become more complex, it is becoming increasingly important to have access to additional debug information beyond the predefined debug information.

To address this issue, the logic states of additional relevant flip-flops may be obtained during a debug process using another information extraction method. For example, the logic states of other flip-flops may be pulled from the SoC during functional testing of that SoC using a scan chain. An example of such use of a scan chain is disclosed in U.S. Patent Application Publication No. 2014/0101500, the disclosure of which is incorporated by reference.

Having the available predefined debug information and additional debug information at hand, a test engineer may analyze the totality of the debug information, develop one or more theories on the source or cause of the functional bug in the SoC, and employ simulation techniques to test these theories. To this end, the test engineer may simulate the same run scenario that created the failure using one or more simulations, such as register transfer level (RTL) simulations. Simulation engines, however, are slow. For example, if a functional failure of an integrated circuit occurs after one hour of operation of the circuit, it can take a number of weeks or months to simulate that failure.

Accordingly, while current debug techniques enable access to sufficient debug information for analysis purposes, inefficiencies remain in the workaround aspects of these techniques. It would be beneficial to enable immediate opportunities to test potential fixes, preferably directly on the SoC under test and without reliance on inefficient simulation techniques.

Disclosed herein is a functional debug methodology that uses scan chain circuitry to collect debug information relevant to a functional bug associated with an integrated circuit. When a functional bug is detected, debug information collection is enabled and the scenario in which the bug was detected is re-run on the integrated circuit. The debug information collected at this stage is predefined and may not be sufficient for bug analysis. Nonetheless, the predefined debug information is used for initial bug analysis. If the reason for the bug is identified, then a potential solution (workaround) may be developed and implemented. The scenario is re-run on the integrated circuit with the potential solution. If the bug is solved, the debug process ends. If the bug is not solved, then additional debug information may be obtained by placing the integrated circuit in scan mode and extracting logic states of select scan chain circuitry relevant to the bug using scan chain techniques. Using the additional debug information, a solution for the bug is proposed and the solution is checked by changing one or more of the extracted logic states of the scan chain circuitry, in accordance with the proposed solution, and pushing the logic states back to the integrated circuit through the scan chain circuitry, including the modified logic states, using scan chain techniques. The scan mode is exited and the integrated circuit then enters a functional mode to test if the one or more changes in logic states fixes the bug.

The functional debug methodology disclosed herein may be particularly beneficial for debugging integrated circuits that are implemented as application specific integrated circuits (ASICs) that perform a specific purpose or function. In ASICs, pin assignments and logic are generally fixed in a silicon chip. Accordingly, an ASIC is generally not amenable to bug fix methodologies that involve reprogramming. For example, a bug in an integrated circuit implemented as a field programmable gate array (FPGAs) may be fixed by reprogramming the logic in the FPGA. In contrast, it may be possible to fix a bug in an ASIC using a firmware (FW) fix. However, if the bug cannot be fixed in FW, a fix in the silicon of the ASIC may be needed, which might require that the ASIC be respun (e.g., redesigned and refabricated).

FIG. 1 is a block diagram of an integrated circuit debug system 100. The integrated circuit debug system 100 includes a circuit debug apparatus 102 and an integrated circuit 104 under debug that is coupled to the circuit debug apparatus 102 through a data interface 106 and a control interface 107. The circuit debug apparatus 102 includes a processor 108, a memory 110, and a user interface 112. The integrated circuit 104 includes functional circuitry 116, a central processor unit (CPU) 118, memory 120, and registers 122. The functional circuitry 116 includes, for example, logic circuit blocks that implement functional features of an apparatus or system in which the integrated circuit 104 is included. For example, in the case of a SSD, functional circuitry 116 of an integrated circuit 104 may perform a read operation, a write operation, a power down operation, etc. Included in the functional circuitry 116 are scan chain circuitry 124 that may be used to implement debugging features disclosed herein. Although not illustrated, each of the circuit debug apparatus 102 and the integrated circuit 104 under debug include data interface elements and control interface elements that respectively define part of the data interface 106 and the control interface 107 that enable communication between the circuit debug apparatus and the integrated circuit.

As is known in the art, integrated circuits are often designed with scan chain circuitry 124 that is used during chip manufacturing to test for various internal fault conditions of an integrated circuit. Scan chain circuitry may include one or more scan chains that are implemented using a series of scan-chain components, which may be used to gain access to internal nodes of the integrated circuit. Scan-chain components, also referred to herein as logic components, may include for example, sequential logic components such as flip-flops or latches. The scan-chain components of a given scan chain are configurable to form a serial shift register for shifting in logic patterns at inputs to functional logic of the integrated circuit. The scan-chain components of a given scan chain may also be used to capture outputs from functional logic of the integrated circuit. In this regard, the scan-chain processes or scan mode included in the debug methodology disclosed herein may be viewed as having a scan capture phase in which the scan-chain components of the scan chain capture scan data, e.g., logic states, from functional circuit blocks or functional logic relevant to a functional bug, and a scan shift-in phase in which the scan-chain components of a scan chain are configured as a serial shift register for shifting in logic patterns for purposes of testing fixes for the functional bug.

Continuing with FIG. 1, the processor 108 of the circuit debug apparatus 102 includes and/or executes a debug module 114 configured to perform various aspects of a debugging methodology on an integrated circuit 104. Aspects of the debug methodology include predefined debug information collection, additional debug information capture and extraction using scan-chain processes, and testing and validation of potential bug solutions also using scan-chain processes.

In one aspect of the debug methodology, the circuit debug apparatus 102 may obtain predefined debug information stored in the memory 120 of the integrated circuit 104. To this end, as part of the debug process executed by the debug module 114, the circuit debug apparatus 102 may communicate with the CPU 118 of the integrated circuit 104 to obtain predefined debug information relevant to a functional bug under investigation. This communication may occur, for example, through the data interface 106, which, in one aspect may be configured to comply with the joint test action group (JTAG) standard. Predefined debug information associated with the functional bug under investigation may be captured during a prior functional test of the integrated circuit and stored in the memory 120. Predefined debug information may also be stored outside of the integrated circuit. For example, it can be "pushed" into an external device/memory. The predefined debug information may include indications of the internal logic states of relevant functional circuitry, which may or may not include all relevant debug information needed to diagnose and resolve a particular functional bug.

In another aspect of the debug methodology, the circuit debug apparatus 102 may obtain additional debug information through a scan-chain operation initiated with respect to the integrated circuit 104. To this end, as part of the debug process executed by the debug module 114, the circuit debug apparatus 102 communicates with the CPU 118 of the integrated circuit 104 to enable scan mode on the integrated circuit for purposes of performing a scan to capture the internal logic states of additional functional circuitry 116, including in particular, the logic states of components of one or more relevant scan chains at the time of the functional failure. This communication between the circuit debug apparatus 102 and integrated circuit 104 may occur through the control interface 107 for purposes of enabling scan mode, and through the data interface 106 for purposes capturing the logic states. Again, the data interface 106 may be a JTAG interface.

During capture of the logic states of components of one or more relevant scan chains, the debug module 114 may provide various clock signals and control signals to the integrated circuit 104. The CPU 118 of the integrated circuit 104 uses these signals to operate the scan chain circuitry 124 to collect additional debug information relevant to the functional circuitry 116 using a serial shift out of logic states from the circuitry. The additional debug information may correspond to internal logic states of the relevant scan chain circuitry 124 and relevant functional logic, and may be stored in the registers 122 and the memory 120 of the integrated circuit 104 or an external memory.

In yet another aspect of the debug methodology, the circuit debug apparatus 102 may test and validate potential solutions to the functional bug using another scan-chain operation initiated on the integrated circuit 104. To this end, as part of the debug process executed by the debug module 114, the circuit debug apparatus 102 communicates with the CPU 118 of the integrated circuit 104 to enable scan mode on the integrated circuit for purposes of shift-inputting, or pushing in, a test pattern of logic states to scan chain circuitry 124 and relevant functional logic. This communication between the circuit debug apparatus 102 and integrated circuit 104 may occur through the control interface 107 for purposes of enabling scan mode and pushing in the test pattern.

During push-in of the test pattern of logic states, the debug module 114 provides various clock signals and control signals to the integrated circuit 104, together with the test pattern of logic states. The CPU 118 of the integrated circuit 104 uses the clock and control signals to operate the scan chain circuitry 124 to serially shift the test pattern into a corresponding serial arrangement of the components (e.g., sequential logic elements such as flip flops) of the scan chain circuitry 124. In such case, the scan chain circuitry 124 is effectively set to a preselected state determined by the test pattern.

After push-in of the test pattern, the circuit debug apparatus 102 communicates with the CPU 118 of the integrated circuit 104 to exit scan mode on the integrated circuit and to execute the functional test that resulted in the functional bug. Upon exit from the scan mode, the pushed-in logic states are preserved at the components of the scan chain circuitry 124 and are input to corresponding functional circuit blocks during the functional test to determine if the functional bug persists.

Figure 2:
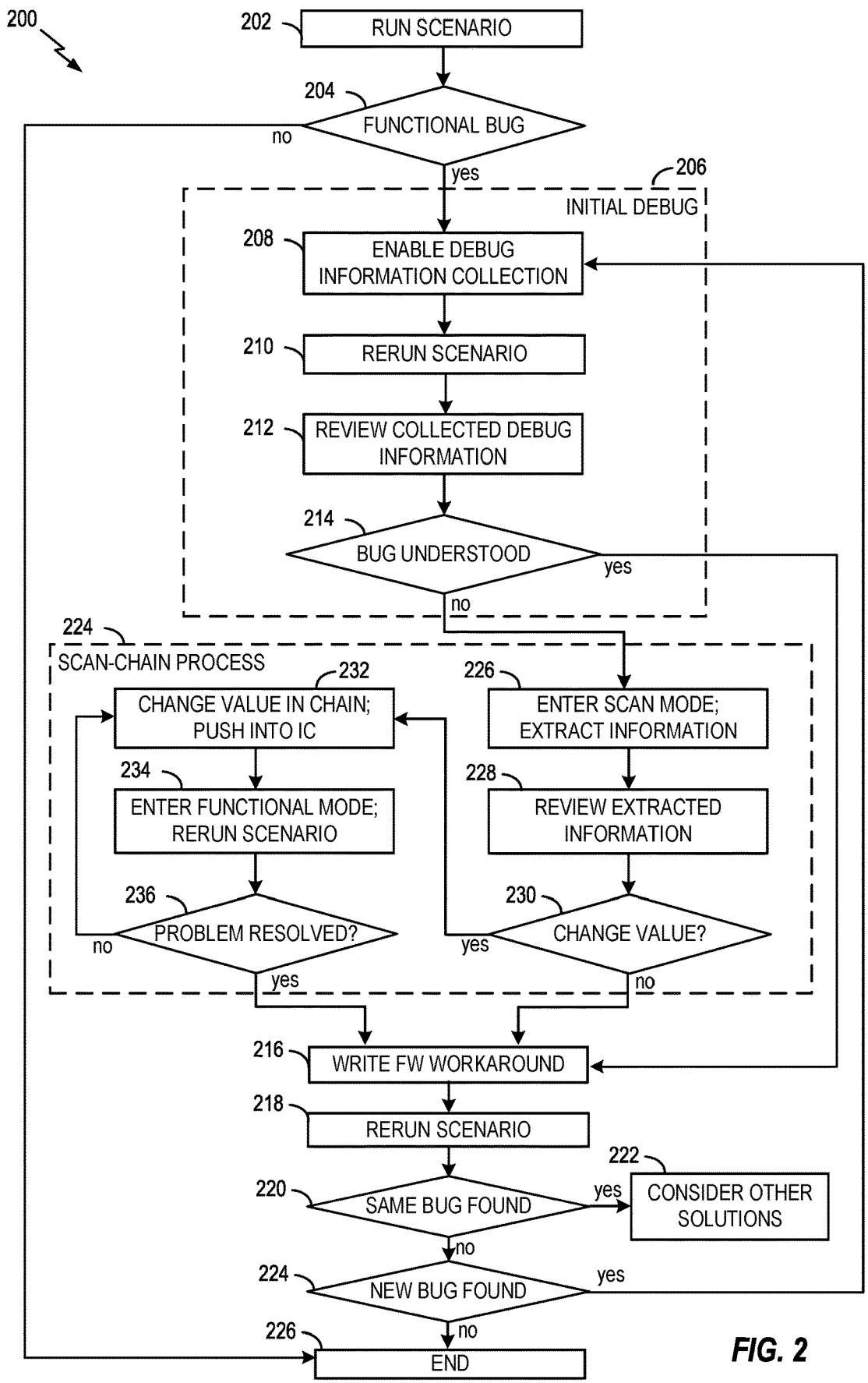
FIG. 2 is a flow chart of an integrated circuit debug process implemented using the system of FIG. 1.

FIG. 2 illustrates a flow chart of a debug methodology 200 for an integrated circuit in accordance with the teachings herein. All or a portion of the debug methodology 200 may be executed by the integrated circuit debug system 100 of FIG. 1.

At block 202, a run scenario is conducted on a system or device that includes an integrated circuit 104. A run scenario may be defined as a function of the system or device that is performed by the integrated circuit 104. For example, in the case of a SSD, a run scenario may be a read operation of the SSD, a write operation of the SSD, a power down operation of the SSD, etc. that is at least partially performed by the integrated circuit 104. The run scenario may be conducted/performed by the integrated circuit debug system 100 or it may be conducted by a different test system.

At block 204, if the function being tested is properly implemented by the integrated circuit 104, i.e., a functional bug is not detected, the process proceeds to block 222 and the process ends. Returning to block 204, if a functional bug is detected, the process proceeds to block 206 where an initial debug process is executed. At this stage, the integrated circuit 104 under debug has likely already passed manufacturing testing, and any defects detected by the debug methodology 200 are assumed to be functional defects.

At block 208, debug information collection is enabled. For example, a test engineer may enable debug information collection through a user interface 112 of the circuit debug apparatus 102. Once debug information collection is enabled, the CPU 118 of the integrated circuit 104 under debug begins to store relevant debug information in the memory 120 of the integrated circuit or an external memory. It is noted that, by default, information collection for an integrated circuit may be disabled until a functional bug is detected.

At block 210, the run scenario of block 202 that resulted in detection of the functional bug at block 204 is rerun. For example, a test engineer may initiate a rerun scenario 210 through the user interface 112 of the circuit debug apparatus 102. Because debug information collection is now enabled (by block 208), the CPU 118 of the integrated circuit 104 stores debug information relevant to the functional bug in the memory 120 of the integrated circuit or an external memory. For example, in the case of an SSD with a read operation bug, the CPU 118 may be programmed to store the logic states of selected (but not all) logic components of the integrated circuit 104 that are involved in the read operation, at the time of the failure.

At block 212, the available debug information is read from the memory 120 of the integrated circuit 104 or an external memory by the integrated circuit debug apparatus 102 and placed in the memory 110 of the debug apparatus. As previously described, the information may be read through a data interface 106, such as a JTAG interface. A test engineer reviews the available debug information. As described above, the available debug information at this stage may include only that information that is made available by the design of the integrated circuit 104. Thus, the available debug information is typically not a complete picture of the state of the integrated circuit 104 (or even a relevant portion of the integrated circuit 104), and may be insufficient to develop an understanding of the reason for the functional bug or a solution.

At block 214, if the available debug information is sufficient to develop an understanding of the cause of the functional bug, the process proceeds to block 216 where a workaround (e.g., potential firmware workaround) may be developed to address and overcome the bug. Returning to block 214, if the available debug information is insufficient to develop an understanding of the cause of bug, the process proceeds to the block 224 where a scan-chain process is executed in order to obtain additional debug information and to possibly test one or more potential fixes for the bug.

Prior to executing the scan-chain process, one or more logic components of the integrated circuit 104 that are relevant to the functional bug are identified. For example, with reference to FIG. 3A, logic components including scan-chain components 304a-304n and functional circuit blocks 306, 308, 310 may be determined to be relevant to the functional bug. Accordingly, it may be beneficial to know the logic states of the scan chain components 304a-304n, and by association, the logic states of the functional circuit blocks 306, 308, 310, at the time the functional bug is reproduced. The scan-chain process 224 provides for the capture of this additional debug information. However, before describing the scan-chain process further, a description of scan chains is provided.

With reference to FIGS. 3A-3D, a scan chain 302 includes a plurality of logic components or scan-chain components 304a-304n that are interspersed with various functional circuit blocks 306, 308, 310 of a functional circuitry 116 that is under functional debug. The scan chain 302 of FIGS. 3A-3D includes a series of scan-chain components 304a-304n, where each component is a sequential logic component such as a flip-flop. Each scan-chain component 304a-304n includes a data (D) input port, a scan input (SD) port, a data (Q) output port, a clock (CLK) input port, and scan enable (SE) control port. While only a single scan chain 302 is shown, it is understood that multiple scan chains may be included in an integrated circuit depending on the type and size of the integrated circuit being debugged. Moreover, the number of scan-chain components 304a-304n in a scan chain 302 may also vary depending on the type and size of the integrated circuit being debugged.

The scan chain 302 of FIGS. 3A-3D also includes various functional circuit blocks 306, 308, 310 that are disposed between adjacent scan-chain components 304a-304n. The functional circuit blocks 306, 308, 310 may include any type of circuits that play a part in implementing the function that is failing during the functional test. By way of example, the functional circuit blocks 306, 308, 310 may be portions of an integrated circuit 104 in a SSD controller application, designed for reading data from, and writing data to, one or more non-volatile memories of an SSD. In other embodiments, the functional circuit blocks 306, 308, 310 may include other types of functional logic circuitry depending on the architecture and function of the integrated circuit.

Figure 3A:
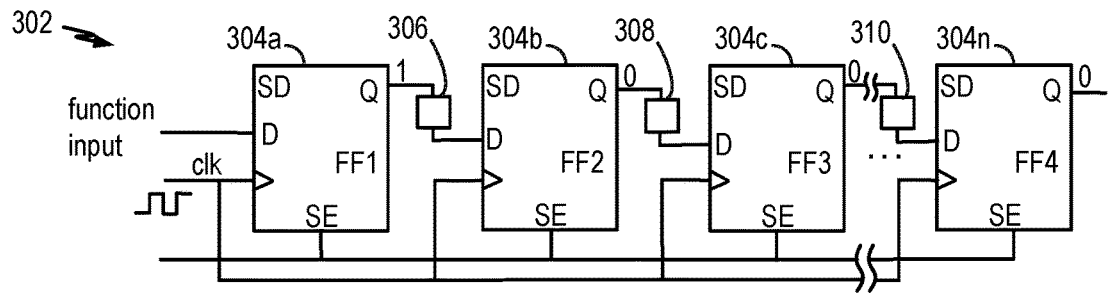
FIGS. 3A-3D illustrate various logic states of a scan chain of an integrated circuit under debug while in functional mode (FIGS. 3A and 3D) and while in scan mode (FIGS. 3B and 3C).
Figure 3B:
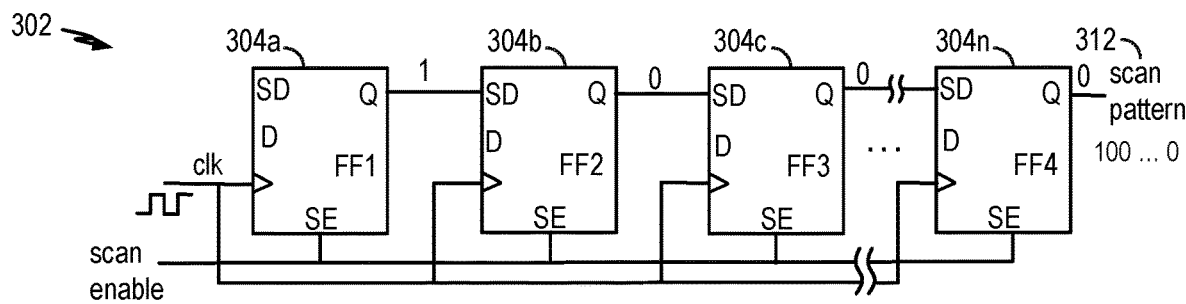
Figure 3C:
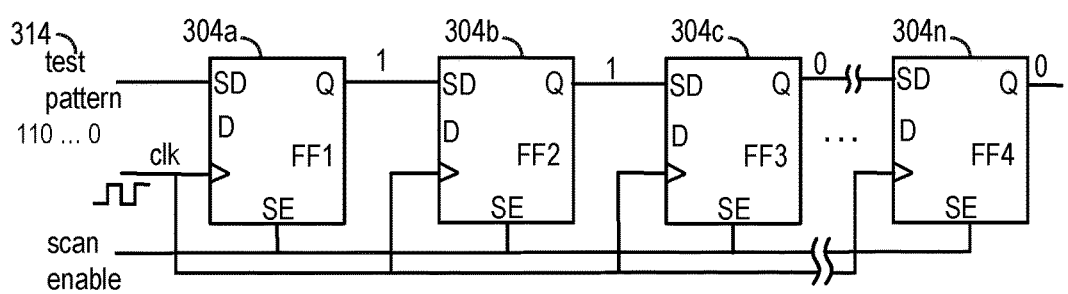
Figure 3D:
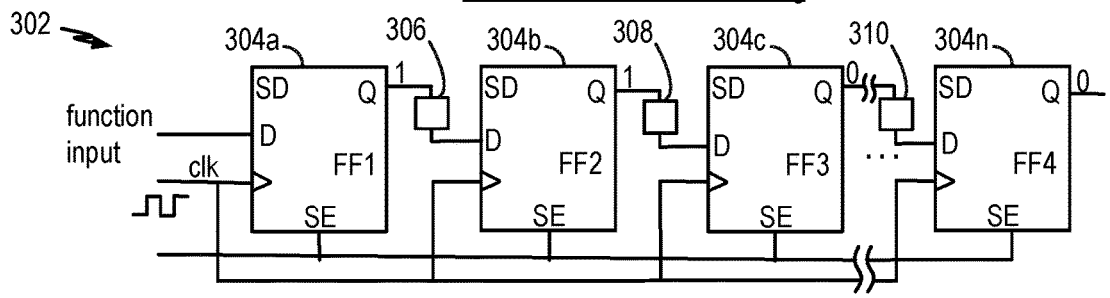

The SE control port receives a SE signal from control logic (not shown) to enable either of a scan mode of operation or a functional mode (e.g., regular or non-scan mode) of operation. For example, in FIGS. 3B and 3C, a SE signal having a first designated logic level (e.g., "on" or a logic "1" level) enables scan-chain components 304a-304n to act as a serial shift register that enables the reading of a scan pattern (FIG. 3B) or the pushing in of a test pattern (FIG. 3C). In FIGS. 3A and 3D, a SE signal having a second designated logic level (e.g., "off" or a logic "0" level) enables scan-chain components 304a-304n to act together with functional circuit blocks 306, 308, 310 to perform a function. In one aspect, any of scan chain components 304a-304n may be implemented such that the "SD" and "D" inputs are inputs to a 2 bit multiplexor where the multiplexor output is selected based on the "SE" input and the multiplexor output is provided as input to a flip flop.

With reference to FIGS. 3A and 3D, during functional mode (SE signal "off") the functional circuit blocks 306, 308, 310 of the scan chain 302 are arranged between the Q output port of one scan-chain component 304a and the D input port of an adjacent downstream scan-chain component 304b in the scan chain. With reference to FIGS. 3B and 3C, during scan mode (SE signal "on") the Q output port of one scan-chain component 304a is connected to the SD port of an adjacent downstream scan-chain component 304b in the scan chain. The Q output port of the last scan-chain component 304n in the scan chains 302 is connected to a preselected input of the scan pattern multiplexer (not shown) that feeds data into registers 122 of the integrated circuit 104.

Returning to FIG. 2, at block 226 of the scan-chain process 224, scan mode is entered. For example, a test engineer may enable scan mode through the user interface 112 of the circuit debug apparatus 102. During scan mode the interconnections of the scan-chain components 304a-304n as shown in FIGS. 3B and 3C provide for the reading out of logic states from scan-chain components (FIG. 3B) and the pushing of logic states into scan-chain components (FIG. 3C).

With reference to FIG. 3B, during a scan capture phase of scan mode, the pattern of logic states of flip-flops 304a-304n in a scan chain 302 at the time of the functional bug (represented in FIG. 3A) are read out of the integrated circuit 104 to provide additional debug information to the test engineer. The logic states may be read out through a serial-shifting of respective logic states through the series of flip-flops 304a-304n. As described above, the scan chain 302 may encompass all flip-flops of the integrated circuit 104 or a particular set of flip-flops that are involved in the implementation of the function that has the bug. In the example scan chain 302 of FIG. 3B, the set of flip-flops 304a-304n may include any number of flip-flops, although only four are illustrated for clarity.

As shown in FIG. 3A, at the time of the functional bug the logic state, i.e., the Q output, of the first flip-flop 304a is 1, the logic state of the second flip-flop 304b is 0, the logic state of the third flip-flop 304c is 0 and so on, with the logic state of the last flip-flop 302n being 0. With reference to FIG. 3B, when scan mode is entered for purposes of a scan capture these same logic states are available for reading as a scan pattern 312. Thus, the scan pattern 312 read by the CPU 118 of the integrated circuit 104 is 100 . . . 0.

At block 228, the test engineer reviews the additional debug information. More specifically, the scan pattern 312 may be considered in conjunction with other available debug information to determine potential workaround solutions to address and/or remove the bug. For example, the test engineer may determine that a change in one or more of the logic states associated with the scan chain 302 may address the functional bug.

At block 230, if the test engineer determines that a change in one or more of the logic states associated with the scan chain 302 may address the functional bug, the process proceeds to block 232, where an initial test pattern is developed and pushed into the scan chain 302 of the integrated circuit. More specifically, and with reference to FIG. 3C, while the integrated circuit 104 under debug is still in scan mode, a test pattern is pushed into the scan-chain components 304a-304n. For example, if a scan pattern 312 from a scan chain 302 of the integrated circuit responsible for the fault is 100 . . . 0 (as shown in FIG. 3B), and it is determined that the functional circuit 308 that receives a logic 0 from the second scan-chain component 304b (shown in FIG. 3A) may be source of the functional fault, then a test pattern 314, e.g., 110 . . . 0, that changes that logic state of the second scan-chain component from 0 to 1 may be tested.

To this end, at block 232, and with additional reference to FIG. 3C, the test pattern 314 is pushed back into the scan chain 302 of the integrated circuit 104 under debug using known techniques. For example, a test engineer may enter the test pattern into the circuit debug apparatus 102 through a user interface 112. Once entered into the circuit debug apparatus 102, the test pattern 314, together with clock and control signals, is communicated to the integrated circuit 104 through the control interface 107, and the test pattern 314 is serial shifted (e.g., serially shifted) into the scan-chain components 304a-304n. As shown in FIG. 3C, once the test pattern 314 is pushed into the scan chain, the logic state, i.e., the Q output, of the first flip-flop 304a is 1, the logic state of the second flip-flop 304b is 1, the logic state of the third flip-flop 304c is 0 and so on, with the logic state of the last flip-flop 302n being 0.

At block 234, the integrated circuit 104 re-enters the functional mode and the scenario that resulted in the bug is rerun on the integrated circuit 104 with the logic states provided by the test pattern 314 having been preserved in the scan chain 302 during the switch from scan mode to functional mode. For example, a test engineer may enter functional mode through the user interface 112 of the circuit debug apparatus 102 and initiate a rerun of the scenario through the control interface 107. During functional mode, the interconnections of the scan-chain components 304a-304n and the functional circuit blocks 306, 308, 310 shown in FIG. 3D provide for the functional testing of functional circuitry of the integrated circuit 104.

At block 236, if the function does not operate properly, the process repeats blocks 232 and 234 during which scan mode is entered, a different test pattern 314 is pushed into the scan chain 302 of the integrated circuit 104 under debug, functional mode is entered, and the scenario is rerun. This process may be repeated until a solution to the bug is found.

Returning to block 236, if the function is operating properly, then the process proceeds to block 216 where the test engineer may develop a firmware (FW) workaround that fixes the functional bug with a change in logic.

At block 218, the firmware workaround is tested by rerunning the scenario that resulted in the functional bug.

For example, the circuit debug apparatus 102 may be configured with a functional testing module and corresponding code configured to execute the scenario on the integrated circuit 104. Such execution may be initiated, for example, by a test engineer through the user interface 112, with the circuit debug apparatus communicating with the integrated circuit through the data interface 106 and the control interface 107.

At block 220, if the same functional bug persists, meaning the firmware workaround did not work, the process proceeds to block 222, where other solutions to fix the bug are considered. For example, a hardware redesign may be considered.

At block 220, if the same functional bug does not persist, the process proceeds to the block 224. If a new bug is found during the rerun of the scenario at block 218, the process returns to block 208 where debug information is collected and the debug process is repeated for the new bug. If a new bug is not found, the process proceeds to block 226 and ends.

Figure 4:
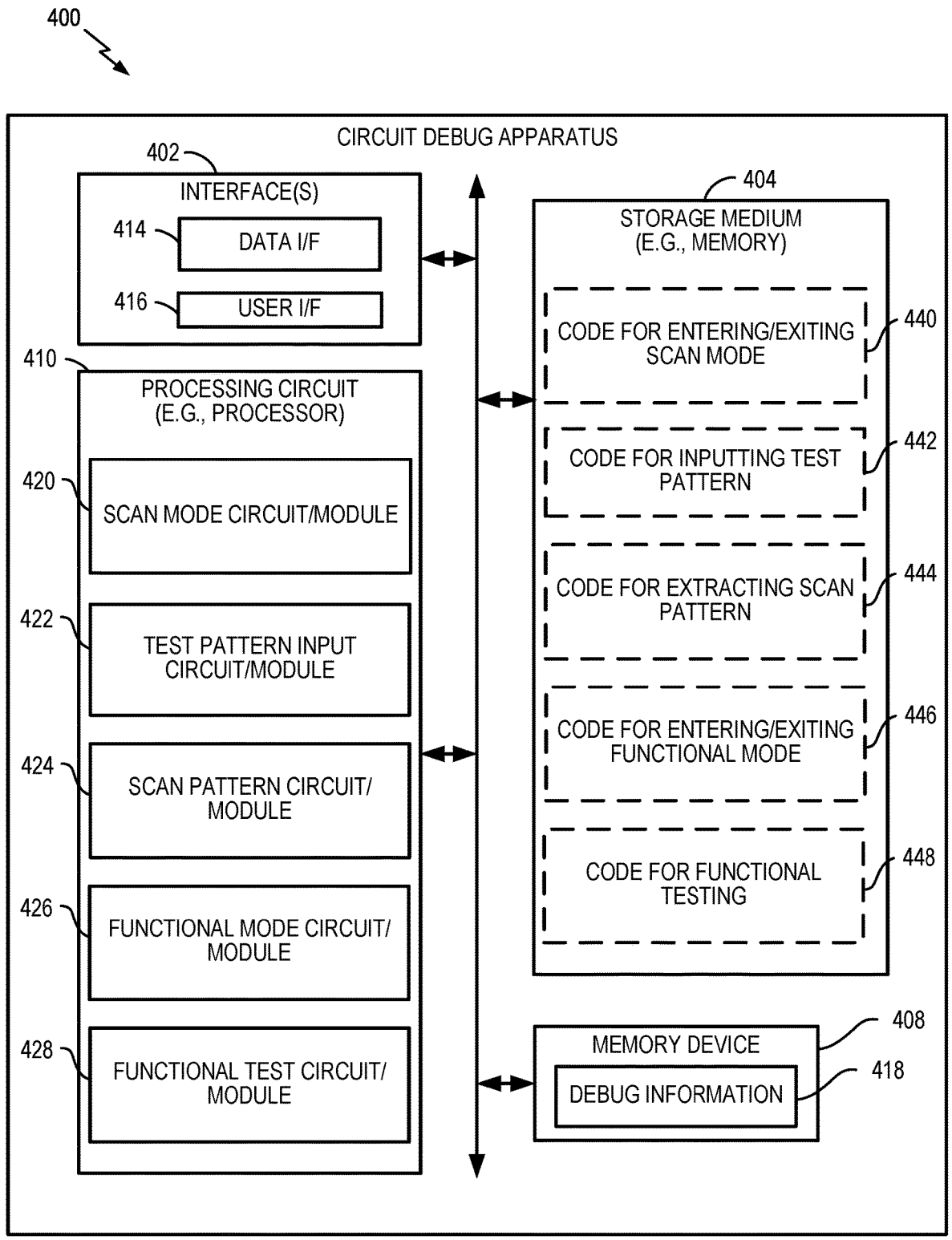
FIG. 4 is a detailed block diagram of the circuit debug apparatus of FIG. 1.

FIG. 4 illustrates an embodiment of a circuit debug apparatus 400 configured to debug an integrated circuit according to one or more aspects of the disclosure. The circuit debug apparatus 400 could be implemented with a computer, a server, or some other type of device that supports circuit testing and debugging.

The circuit debug apparatus 400 includes one or more interfaces 402, a storage medium 404, a memory device 408, and a processing circuit 410, e.g., at least one processor. These components can be coupled to and/or placed in electrical communication with one another via a signaling bus or other suitable component, represented generally by the connection lines in FIG. 4. The signaling bus may include any number of interconnecting buses and bridges depending on the specific application of the processing circuit 410 and the overall design constraints. The signaling bus links together various circuits such that each of the interfaces 402, the storage medium 404, and the memory device 408 are coupled to and/or in electrical communication with the processing circuit 410. The signaling bus may also link various other circuits (not shown) such as timing sources, peripherals, voltage regulators, and power management circuits, which are well known in the art, and therefore, will not be described any further.

The interfaces 402 provides a means for communicating with other apparatuses. One such interface 402 may be a data interface 414 that includes circuitry and/or programming (e.g., a program) adapted to facilitate the communication of information with respect to one or more other devices including, for example, debug information. Another such interface may be a user interface 416 that enables a user of the circuit debug apparatus 400 to initiate and control a debug process. A user interface 416 may be, for example, a graphical user interface (GUI) or a keyboard. The interfaces 402 may be configured for wire-based communication. For example, the data interface 414 could be a bus interface, a send/receive interface, or some other type of signal interface including drivers, buffers, or other circuitry for outputting and/or obtaining signals. In some implementations, the interfaces 402 may be configured for wireless communication.

The memory device 408 may represent one or more memory devices. As indicated, the memory device 408 may maintain debug information 418 along with other information used by the circuit debug apparatus 400. The memory device 408 may be coupled to the processing circuit 410 such that the processing circuit can read information from, and write information to, the memory device. In some implementations, the memory device 408 and the storage medium 404 are implemented as a common memory component.

The storage medium 404 may represent one or more computer-readable, machine-readable, and/or processor-readable devices for storing programming, such as processor executable code or instructions (e.g., software, firmware), electronic data, databases, or other digital information. The storage medium 404 may be any available media that can be accessed by a general purpose or special purpose processor, including portable or fixed storage devices, optical storage devices, and various other mediums capable of storing, containing or carrying programming.

By way of example and not limitation, the storage medium 404 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 404 may be embodied in an article of manufacture (e.g., a computer program product). By way of example, a computer program product may include a computer-readable medium in packaging materials. In view of the above, in some implementations, the storage medium 404 may be a non-transitory (e.g., tangible) storage medium. For example, the storage medium 404 may be a non-transitory computer-readable medium storing computer-executable code, including code to perform operations as described herein.

The storage medium 404 may be coupled to the processing circuit 410 such that the processing circuit can read information from, and write information to, the storage medium. That is, the storage medium 404 can be coupled to the processing circuit 410 so that the storage medium is at least accessible by the processing circuit, including examples where at least one storage medium is integral to the processing circuit and/or examples where at least one storage medium is separate from the processing circuit (e.g., resident in the apparatus 400, external to the apparatus, distributed across multiple entities, etc.).

Programming stored by the storage medium 404, when executed by the processing circuit 410, causes the processing circuit to perform one or more of the various functions and/or process operations described herein. For example, the storage medium 404 may include operations configured for regulating operations at one or more hardware blocks of the processing circuit 410, as well as to utilize the one or more interfaces 402 for communication with an integrated circuit under debug.

The processing circuit 410 is generally adapted for processing, including the execution of such programming stored on the storage medium 404. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 410 is arranged to obtain, process and/or send data, control data access and storage, issue commands, and control other desired operations. The processing circuit 410 may include circuitry configured to implement desired programming provided by appropriate media in at least one example. For example, the processing circuit 410 may be implemented as one or more processors, one or more controllers, and/or other structure configured to execute executable programming. Examples of the processing circuit 410 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 410 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 410 are for illustration and other suitable configurations within the scope of the disclosure are also contemplated.

According to one or more aspects of the disclosure, the processing circuit 410 may be adapted to perform any or all of the features, processes, functions, operations and/or routines for any or all of the apparatuses described herein. For example, the processing circuit 410 may be configured to perform any of the steps, functions, and/or processes described with respect to FIGS. 2 and 5. As used herein, the term "adapted" in relation to the processing circuit 410 may refer to the processing circuit being one or more of configured, employed, implemented, and/or programmed to perform a particular process, function, operation and/or routine according to various features described herein.

According to at least one example of the circuit debug apparatus 400, the processing circuit 410 may include one or more of a circuit/module for entering/exiting scan mode 420, a circuit/module for inputting a test pattern in a scan chain 422, a circuit/module for extracting a scan pattern 424, a circuit/module for entering/exiting functional mode 426, and a circuit/module for executing a functional test 428. In various implementations, the circuit/module for entering/exiting scan mode 420, the circuit/module for inputting a test pattern in a scan chain 422, the circuit/module for extracting a scan pattern 424, the circuit/module for entering/exiting functional mode 426, and the circuit/module for executing a functional test 428 may provide and/or incorporate, at least in part, the functionality described above for the circuit debug apparatus 102 of FIG. 1.

As mentioned above, a program stored by the storage medium 404, when executed by the processing circuit 410, causes the processing circuit to perform one or more of the various functions and/or process operations described herein. For example, the program may cause the processing circuit 410 to perform the various functions, steps, and/or processes described herein with respect to FIGS. 2 and 5 in various implementations. The storage medium 404 may include one or more of code for entering/exiting scan mode 440, code for inputting a test pattern in a scan chain 442, code for extracting a scan pattern 444, code for entering/exiting functional mode 446, and code for executing a functional test 448. In various implementations, the code for entering/exiting scan mode 440, the code for inputting a test pattern in a scan chain 442, the code for extracting a scan pattern 444, the code for entering/exiting functional mode 446, and the code for executing a functional test 448 may be executed or otherwise used to provide the functionality described herein for the circuit/module for entering/exiting scan chain 420, the circuit/module for inputting a test pattern in a scan chain 422, a circuit/module for extracting a scan pattern 424, a circuit/module for entering/exiting functional mode 426, and a circuit/module for executing a functional test 428.

Figure 5:
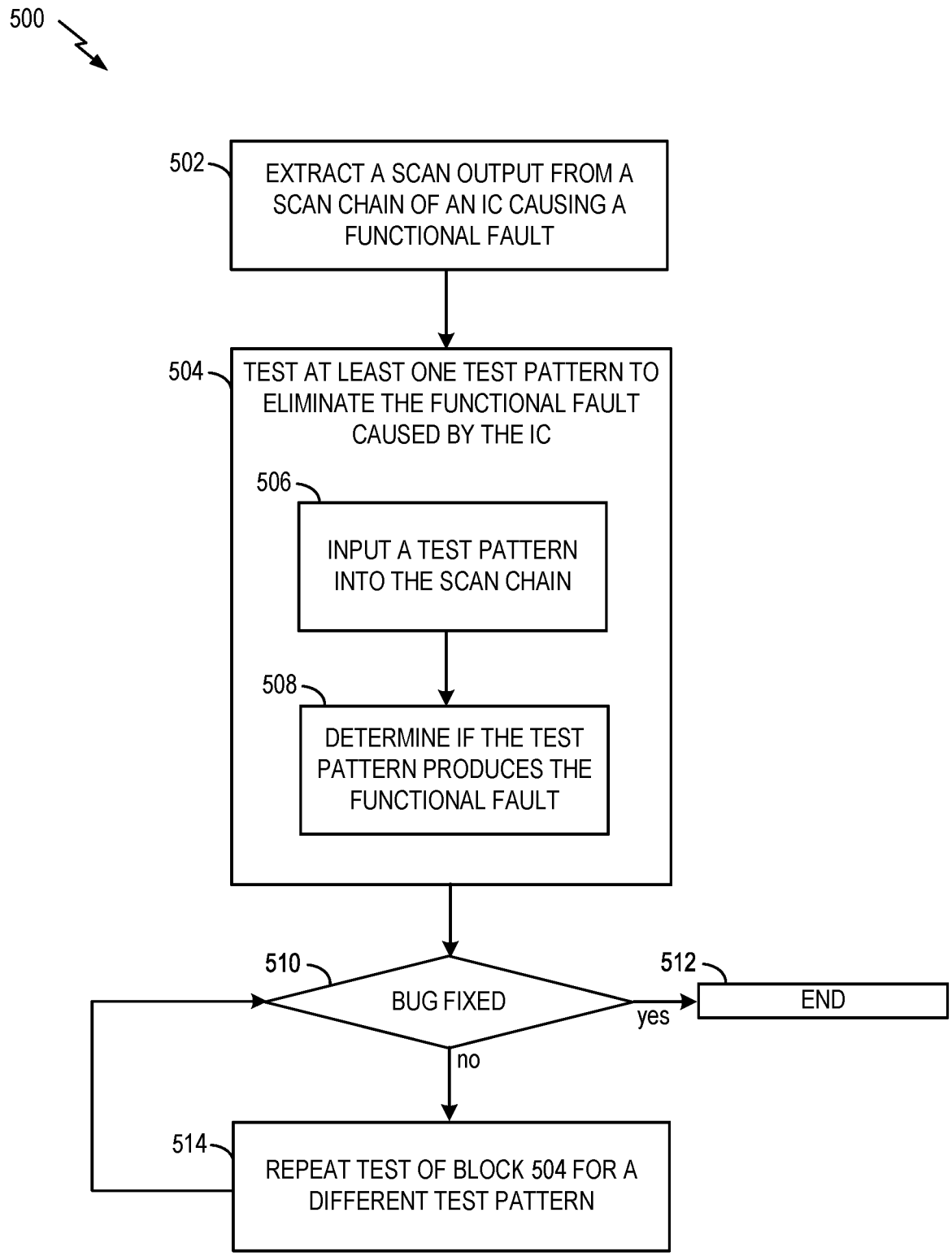
FIG. 5 is a flow chart of an integrated circuit debug process implemented using the circuit debug apparatus of FIG. 4.

The processing circuit 410 may be a specialized processor, such as an application-specific integrated circuit (ASIC) that serves as a means for (e.g., structure for) carrying out any one of the operations described in conjunction with FIGS. 2 and 5. In various implementations, the processing circuit 410 may provide and/or incorporate, at least in part, the functionality described above for the circuit debug apparatus 102 of FIG. 1.

The processing circuit 410, together with the storage medium 404 and the data interface 414 is one example of means for extracting, while an integrated circuit is in a scan mode, a scan chain pattern comprising a plurality of logic states for a corresponding plurality of sequential logic circuits of the integrated circuit. The processing circuit 410, together with the storage medium 404, is one example of means for applying, while the integrated circuit is in a scan mode, a modified scan chain pattern to the integrated circuit, wherein the modified scan chain pattern includes a test pattern configured to eliminate the functional fault. The processing circuit 410, together with the storage medium 404, is one example of means for determining, while the integrated circuit is in the functional mode, whether the integrated circuit with the modified scan chain pattern produces the functional fault. The means for determining may include means for executing a functional test at the integrated circuit that previously produced the functional fault.

The processing circuit 410, together with the storage medium 404, is one example of means for testing a different modified scan pattern responsive to the modified scan chain pattern producing the functional fault. The means for testing a different modified scan chain pattern include means for applying, while the integrated circuit is in a scan mode, the different modified scan chain pattern into the integrated circuit, and means for determining, while the integrated circuit is in the functional mode, whether the integrated circuit with the different modified scan chain pattern produces the functional fault. Structure corresponding to the means for applying and the means for determining may be the processing circuit 410, together with the storage medium 404. The processing circuit 410, together with the storage medium 404, is one example of means for repeating the functions of the means for applying and the means for determining for each of a plurality of different modified scan chain patterns until a fix pattern is found, wherein the fix pattern corresponds to a modified scan chain pattern that does not produce the functional fault.

FIG. 5 is a flowchart of a process 500 of debugging an integrated circuit 104 that causes a functional fault while the integrated circuit is in a functional mode. In one aspect, the process 500 may be performed by a processing circuit, e.g., the processing circuit 410 of a circuit debug apparatus 400. Of course, in various aspects within the scope of the disclosure, the process 500 may be implemented by any suitable apparatus capable of supporting memory-related operations.

At block 502, the circuit debug apparatus 400 extracts a scan pattern 312 of a scan chain 302 of the integrated circuit 104. The scan pattern 312 comprises a plurality of logic states for a corresponding plurality of logic circuits 304a-304n that define the scan chain, and is extracted while the integrated circuit 104 is in a scan mode. As part of the process of block 502 the circuit debug apparatus 400 may communicate with the integrated circuit 104 to cause the integrated circuit to enter the scan mode if it is not already in scan mode. The circuit debug apparatus 400 may extract the scan pattern 312 by reading the scan pattern from a storage, e.g., a memory 120 or a register 122, of the integrated circuit 104.

At block 504, the circuit debug apparatus 400 tests at least one test pattern 314 to see if the test pattern eliminates the functional fault. To this end, at block 506 the circuit debug apparatus 400 may input a test pattern 314 into the scan chain 302 while the integrated circuit 104 is in a scan mode. The test pattern 314 is based on the scan pattern 312 and may comprise at least one logic state different from the plurality of logic states of the scan pattern. As part of the process of block 506 the circuit debug apparatus 400 may communicate with the integrated circuit 104 to cause the integrated circuit to enter the scan mode if it is not already in scan mode. The circuit debug apparatus 400 may also input the test pattern 314 into the scan chain 302 by communicating the test pattern to the integrated circuit 104, together with one or more of clock signals and control signals, to enable a serial shifting in of the plurality of logic states into the corresponding plurality of logic circuits that define the scan chain.

At block 508, while the integrated circuit 104 is in the functional mode, the circuit debug apparatus 400 determines if the test pattern 314 produces the functional fault. As part of the process of block 508 the circuit debug apparatus 400 may communicate with the integrated circuit 104 to cause the integrated circuit to enter the functional mode after the inputting of the test pattern in block 506 is complete. The circuit debug apparatus 400 may also determine if the test pattern 314 produces the functional fault by executing a functional test that resulted in the functional fault.

At block 510, if the test pattern 314 fixes the functional bug, i.e., the functional bug does not occur during the functional test, the process proceeds to block 512 and ends. If, however, the bug is not fixed the process continues to block 514.

At block 514, in response to the at least one test pattern 314 tested in block 504 resulting in the functional fault, the circuit debug apparatus 400 tests a different test pattern. To this end, the circuit debug apparatus 400 inputs the different test pattern into the scan chain 302 while the integrated circuit 104 is in a scan mode and determines if the different test pattern results in the functional fault while the integrated circuit is in the functional mode. Block 514 may be repeated for each of a plurality of different test patterns 314 until a fix pattern is found, wherein the fix pattern corresponds to a test pattern that does not result in the functional fault.

Figure 6:
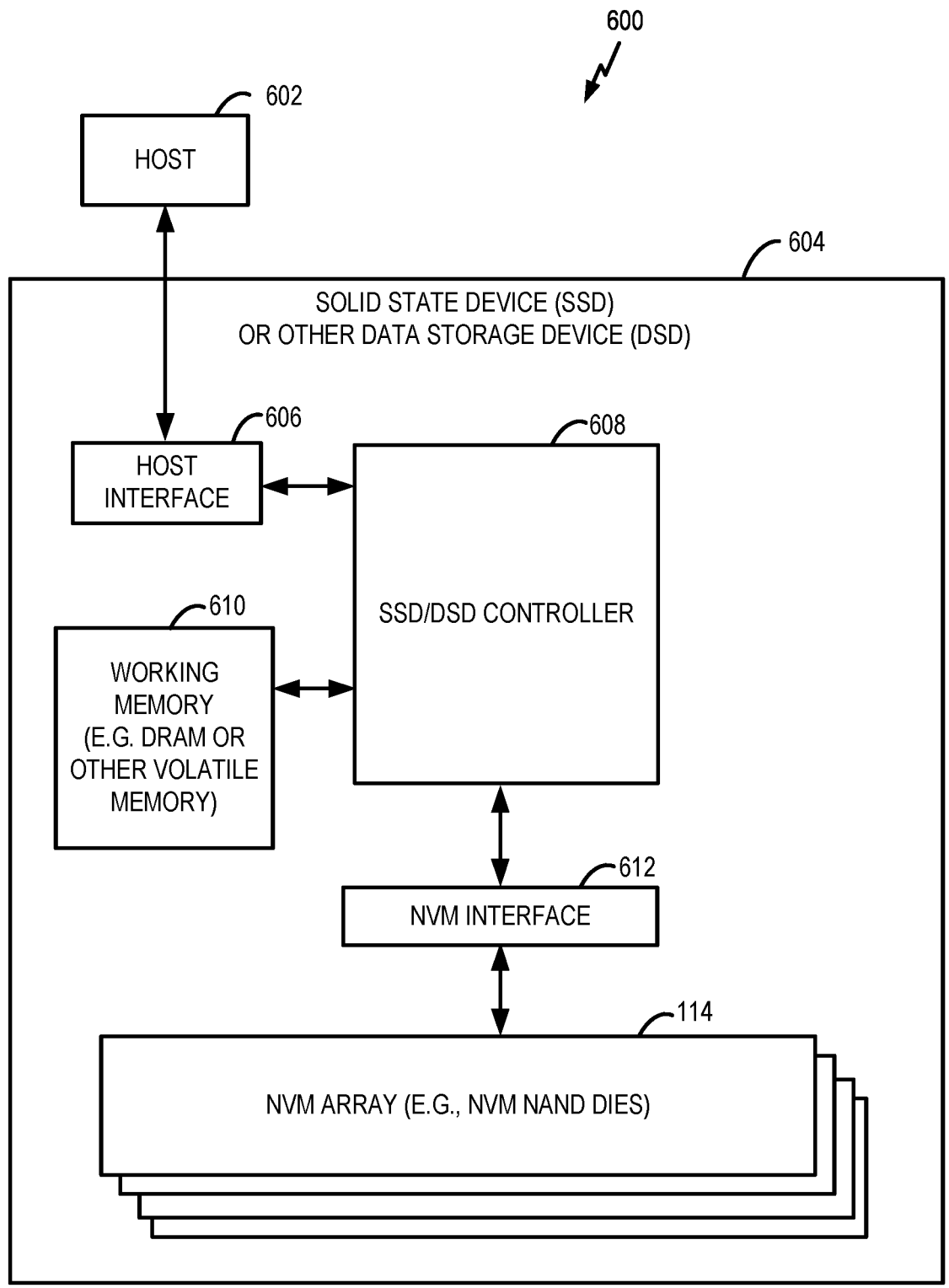
FIG. 6 is a block diagram of a solid state device (SSD) having integrated circuits that may be debugged using the apparatus of FIG. 4 and the process of FIG. 5.

FIG. 6 is a block diagram of a system 600 that may include integrated circuits that may be debugged as taught herein. The system 600 includes a host 602 and an SSD 604 (or other DSD, but for simplicity referred to as an SSD below) coupled to the host 602. The host 602 provides commands to the SSD 604 for transferring data between the host 602 and the SSD 604. For example, the host 602 may provide a write command to the SSD 604 for writing data to the SSD 604 or read command to the SSD 604 for reading data from the SSD 604. The host 602 may be any system or device having a need for data storage or retrieval and a compatible interface for communicating with the SSD 604. For example, the host 602 may a computing device, a personal computer, a portable computer, a workstation, a server, a personal digital assistant, a digital camera, or a digital phone as merely a few examples.

The SSD 604 includes a host interface 606, an SSD or DSD controller 608, a working memory 610 (such as DRAM or other volatile memory), an NVM interface 612, and an NVM array 614 having one or more dies. The host interface 606 is coupled to the controller 608 and facilitates communication between the host 602 and the controller 608. The controller 608 is coupled to the volatile memory 610 as well as to the NVM array 614 via the NVM interface 612. The host interface 606 may be any suitable communication interface, such as a Non-Volatile Memory express (NVMe) interface, a Universal Serial Bus (USB) interface, a Serial Peripheral (SP) interface, a Universal Flash Storage (UFS) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 602 includes the SSD 604. In other embodiments, the SSD 604 is remote from the host 602 or is contained in a remote computing system communicatively coupled with the host 602. For example, the host 602 may communicate with the SSD 604 through a wireless communication link. The NVM array 614 may include multiple dies.

Although, in the example illustrated in FIG. 6, SSD 604 includes a single channel between controller 608 and NVM array 614 via interface 612, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. The controller 608 may be implemented in a single integrated circuit chip and may communicate with different layers of memory in the NVM 614 over one or more command channels. Also, SSD 604 may include multiple host interfaces 606 which may be coupled to one or more hosts 602.

The controller 608 controls operation of the SSD 604. In various aspects, the controller 608 receives commands from the host 602 through the host interface 606 and performs the commands to transfer data between the host 602 and the NVM array 614. Furthermore, the controller 608 may manage reading from and writing to volatile memory 610 for performing the various functions effected by the controller and to maintain and manage cached information stored in the volatile memory 610.

The controller 608 may include any type of processing device, such as a microprocessor, a microcontroller, an embedded controller, a logic circuit, software, firmware, or the like, for controlling operation of the SSD 604. In some aspects, some or all of the functions described herein as being performed by the controller 608 may instead be performed by another element of the SSD 604. For example, the SSD 604 may include a microprocessor, a microcontroller, an embedded controller, a logic circuit, software, firmware, application specific integrated circuit (ASIC), or any kind of processing device, for performing one or more of the functions described herein as being performed by the controller 608. According to other aspects, one or more of the functions described herein as being performed by the controller 608 are instead performed by the host 602. In still further aspects, some or all of the functions described herein as being performed by the controller 608 may instead be performed by another element such as a controller in a hybrid drive including both non-volatile memory elements and magnetic storage elements.

The working memory 610 may be any suitable memory, computing device, or system capable of storing data. For example, working volatile memory 610 may be any combination of ordinary RAM, DRAM, double data rate (DDR) RAM, static RAM (SRAM), synchronous dynamic RAM (SDRAM), a flash storage, an erasable programmable read-only-memory (EPROM), an electrically erasable programmable ROM (EEPROM), or the like. In various embodiments, the controller 608 uses the working memory 610, or a portion thereof, to store data during the transfer of data between the host 602 and the NVM array 614. For example, the working memory 610 or a portion of the volatile memory 610 may be a cache memory. The NVM array 614 receives data from the controller 608 via the NVM interface 612 and stores the data. In some embodiments, working memory 610 may be replaced by, or supplemented with, a non-volatile memory such as MRAM, PCM, ReRAM, etc. to serve as a working memory for the overall device.

Although FIG. 6 shows an exemplary SSD and an SSD is generally used as an illustrative example in the description throughout, the various disclosed embodiments are not necessarily limited to an SSD application/implementation. As an example, the disclosed NVM array and associated processing components can be implemented as part of a package that includes other processing circuitry and/or components. For example, a processor may include, or otherwise be coupled with, embedded NVM array and associated circuitry. The processor could, as one example, off-load certain operations to the NVM and associated circuitry and/or components. As another example, the SSD controller 608 may be a controller in another type of device and still be configured to perform or control the prediction of an estimated future host access rate of MPEG data and perform some or all of the other functions described herein.

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

In one aspect, either the SSD controller 608 or the NVM 614 may be implemented using one or more ASICs. In such case, the methods and apparatuses for debugging integrated circuit systems described herein can be applied to these ASICs.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A method of debugging an integrated circuit that causes a functional fault while the integrated circuit is in a functional mode, the method comprising:
   extracting, while the integrated circuit is in a scan mode, a scan pattern of a scan chain of the integrated circuit captured at the time of the functional fault, the scan pattern comprising a plurality of logic states for a corresponding plurality of logic circuits that define the scan chain;
   testing a test pattern to determine if the test pattern does not result in the functional fault, the testing comprising:
   causing the integrated circuit to enter the scan mode;
   inputting the test pattern into the scan chain;
   causing the integrated circuit to enter the functional mode after the inputting of the test pattern; and
   determining if the test pattern does not result in the functional fault; and
   responsive to the test pattern resulting in the functional fault, repeating the testing with a different test pattern.

2. The method of claim 1, further comprising responsive to the different test pattern resulting in the functional fault, repeating the testing for each of a plurality of different test patterns until a fix pattern is found, wherein the fix pattern corresponds to a test pattern that does not result in the functional fault.

3. The method of claim 1, wherein determining if the test pattern does not result in the functional fault comprises executing a functional test that previously resulted in the functional fault.

4. The method of claim 1, wherein:
   the extracting the scan pattern comprises reading the scan pattern from a storage of the integrated circuit; and
   the inputting the test pattern into the scan chain comprises communicating the test pattern to the integrated circuit, together with one or more of clock signals and control signals, to enable a serial shifting of the plurality of logic states into the corresponding plurality of logic circuits.

5. A circuit debug apparatus for debugging an integrated circuit that causes a functional fault while the integrated circuit is in a functional mode, the apparatus comprising: means for extracting, while the integrated circuit is in a scan mode, a scan chain pattern comprising a plurality of logic states for a corresponding plurality of sequential logic circuits of the integrated circuit captured at the time of the functional fault; means for testing a modified scan chain pattern to determine if the modified scan chain pattern does not produce the functional fault, wherein the modified scan chain pattern includes a test pattern and the means for testing comprises: means for causing the integrated circuit to enter the scan mode; means for applying the modified scan chain pattern to the integrated circuit; means for causing the integrated circuit to enter the functional mode after applying the modified scan chain pattern; and means for determining whether the integrated circuit with the modified scan chain pattern does not produce the functional fault; and means for repeating the function of the means for testing with a different modified scan pattern in response to the modified scan chain pattern producing the functional fault.

6. The apparatus of claim 5, further comprising means for further repeating the function of the means for repeating for each of a plurality of different modified scan chain patterns until a fix pattern is found, wherein the fix pattern corresponds to a modified scan chain pattern that does not produce the functional fault.

7. The apparatus of claim 5, wherein the plurality of sequential logic circuits comprises a subset of all sequential logic circuits of the integrated circuit.

8. The apparatus of claim 7, wherein the subset comprises all sequential logic circuits in a preselected portion of the integrated circuit.

9. The apparatus of claim 5, wherein the plurality of sequential logic circuits comprises all sequential logic circuits of the integrated circuit.

10. The apparatus of claim 5, wherein the means for determining whether the integrated circuit with the modified scan chain pattern does not produce the functional fault comprises means for executing a functional test at the integrated circuit that previously produced the functional fault.

11. The apparatus of claim 5, wherein the modified scan chain pattern comprises at least one logic state different from the plurality of logic states of the scan chain pattern.

12. A circuit debug apparatus for debugging an integrated circuit that causes a functional fault while the integrated circuit is in a functional mode, the apparatus comprising: a processor configured to: extract a scan pattern of a scan chain of the integrated circuit while the integrated circuit is in a scan mode, the scan pattern comprising a plurality of logic states for a corresponding plurality of logic circuits of the integrated circuit captured at the time of the functional fault; test a modified scan pattern to determine if the modified scan pattern does not produce the functional fault, wherein the modified scan pattern includes a test pattern and the processor tests the modified scan pattern by being further configured to: cause the integrated circuit to enter the scan mode; apply the modified scan pattern to the integrated circuit; and cause the integrated circuit to enter the functional mode after applying the modified scan pattern; and determine whether the integrated circuit with the modified scan pattern does not produce the functional fault; and repeat the test with a different modified scan pattern in response to the modified scan pattern producing the functional fault.

13. The apparatus of claim 12, wherein the processor extracts a scan pattern by being further configured to:
   cause the integrated circuit to enter the scan mode; and
   communicate with the integrated circuit to receive the scan pattern.

14. The apparatus of claim 12, wherein the processor applies the modified scan pattern by being further configured to:
   communicate the modified scan pattern to the integrated circuit.

15. The apparatus of claim 12, wherein the functional fault is detected during a run scenario that tests the functionality of the integrated circuit, and the processor is configured to determine whether the integrated circuit with the modified scan pattern does not produce the functional fault by being further configured to:
   rerun the run scenario on the integrated circuit.

16. The apparatus of claim 12, wherein
   the different modified scan pattern includes a different test pattern.

17. The apparatus of claim 12, wherein the test pattern comprises at least one logic state different from the plurality of logic states of the scan pattern.

* * * * *